United States Patent
Suryan

(10) Patent No.: US 8,872,504 B2
(45) Date of Patent: Oct. 28, 2014

(54) METHOD FOR AUTOMATICALLY SETTING FREQUENCY SPAN IN A SPECTRUM ANALYZER

(75) Inventor: David L. Suryan, Hillsboro, OR (US)

(73) Assignee: Tektronix, Inc., Beaverton, OR (US)

(*) Notice: Subject to any disclaimer, the term of this patent is extended or adjusted under 35 U.S.C. 154(b) by 410 days.

(21) Appl. No.: 13/327,476

(22) Filed: Dec. 15, 2011

(65) Prior Publication Data

US 2012/0274309 A1  Nov. 1, 2012

Related U.S. Application Data

(60) Provisional application No. 61/480,494, filed on Apr. 29, 2011.

(51) Int. Cl.
   *G01R 23/165* (2006.01)
   *G01R 23/16* (2006.01)

(52) U.S. Cl.
   CPC ..................... *G01R 23/16* (2013.01)
   USPC ..................................... 324/76.29

(58) Field of Classification Search
   CPC .......................... G01R 23/16–23/20
   USPC ................. 324/76.19–76.38, 77.11
   See application file for complete search history.

(56) References Cited

U.S. PATENT DOCUMENTS

| | | | |
|---|---|---|---|
| 3,450,989 A * | 6/1969 | Dickinson | 324/76.31 |
| 4,118,666 A * | 10/1978 | Bernstein | 324/76.26 |
| 4,607,215 A | 8/1986 | Takano et al. | |
| 4,665,494 A * | 5/1987 | Tanaka et al. | 702/77 |
| 5,559,900 A * | 9/1996 | Jayant et al. | 382/248 |
| 5,612,617 A * | 3/1997 | Waguri | 324/76.45 |
| 5,617,523 A * | 4/1997 | Imazu et al. | 345/440 |
| 5,978,487 A * | 11/1999 | Kusaba | 381/56 |
| 6,151,559 A * | 11/2000 | Williams | 702/58 |
| 6,359,429 B1 | 3/2002 | Arai et al. | |
| 7,765,075 B2 * | 7/2010 | Feldhaus et al. | 702/77 |
| 2011/0150062 A1 * | 6/2011 | Inadomaru et al. | 375/224 |

\* cited by examiner

*Primary Examiner* — Patrick Assouad
*Assistant Examiner* — Demetrius Pretlow
(74) *Attorney, Agent, or Firm* — Marger Johnson & McCollom PC; Thomas F. Lenihan

(57) ABSTRACT

Embodiments of this invention include a test and measurement instrument and associated methods for automatically setting frequency span in a spectrum analyzer. For example, starting with a high reference level, the power level can be automatically measured for each band. If a suitable minimum power is not found in one of the bands, the reference level can be automatically and iteratively decreased until the suitable minimum power is found, or until the most sensitive power level is reached. This assures enough sensitivity to correctly determine the signal power level and not make decisions based on noise. When power on any band is greater than the predefined noise criteria, then the band having the highest power level can be selected, and the center frequency and span for the band measuring the most power can be automatically set.

15 Claims, 3 Drawing Sheets

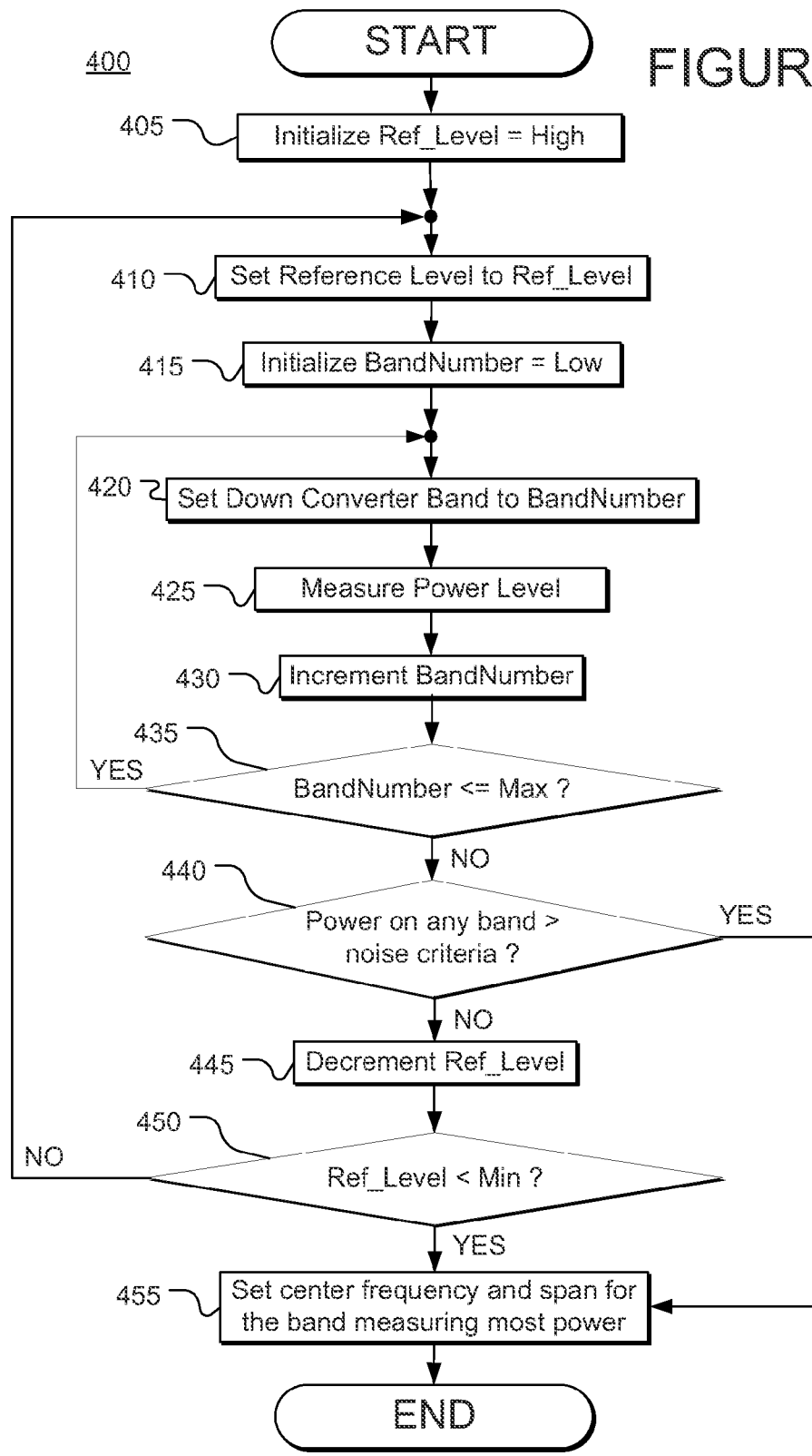

METHOD FOR AUTOMATICALLY SETTING FREQUENCY SPAN IN A SPECTRUM ANALYZER

RELATED APPLICATION DATA

This application claims the benefit of U.S. Provisional Application No. 61/480,494, filed on Apr. 29, 2011, which is hereby incorporated by reference.

BACKGROUND

Spectrum analyzers are test and measurement tools that are widely used by engineers and technicians to measure the frequency content of an RF signal, as well as other functions involving power and time. As the technology has advanced, some conventional functions that were once manually controlled became more automated so that less setup and configuration actions were required to be performed by the user.

For example, U.S. Pat. No. 4,607,215 discusses a spectrum analyzer in which the degree of attenuation provided by the input attenuator of the spectrum analyzer could be automatically set to an optimum value with regard to the prevention of generation of spurious signal components within the spectrum analyzer due to distortion, i.e., primarily due to harmonic distortion resulting from nonlinearity of the mixer frequency conversion characteristics when a large amplitude signal was applied.

Nevertheless, it is still necessary in traditional spectrum analyzers for a human to manually configure certain settings based on knowledge of the signal or its characteristics before extracting a useful measurement or producing a useful spectrum. Given that the feature set of spectrum analyzers continues to expand, along with the complexity of multi-band architectures, mixed domain oscilloscopes (MDOs), and the like, it would be desirable to automate more of the initial configuration settings. Accordingly, a need remains for an improved spectrum analyzer capable of automatically setting the center frequency, span, and/or down converter signal path.

BRIEF DESCRIPTION OF THE DRAWINGS

FIG. 4 illustrates a flow diagram demonstrating a technique for automatically setting frequency span and other related configuration settings according to another example embodiment of the invention.

DETAILED DESCRIPTION

Figure 1:
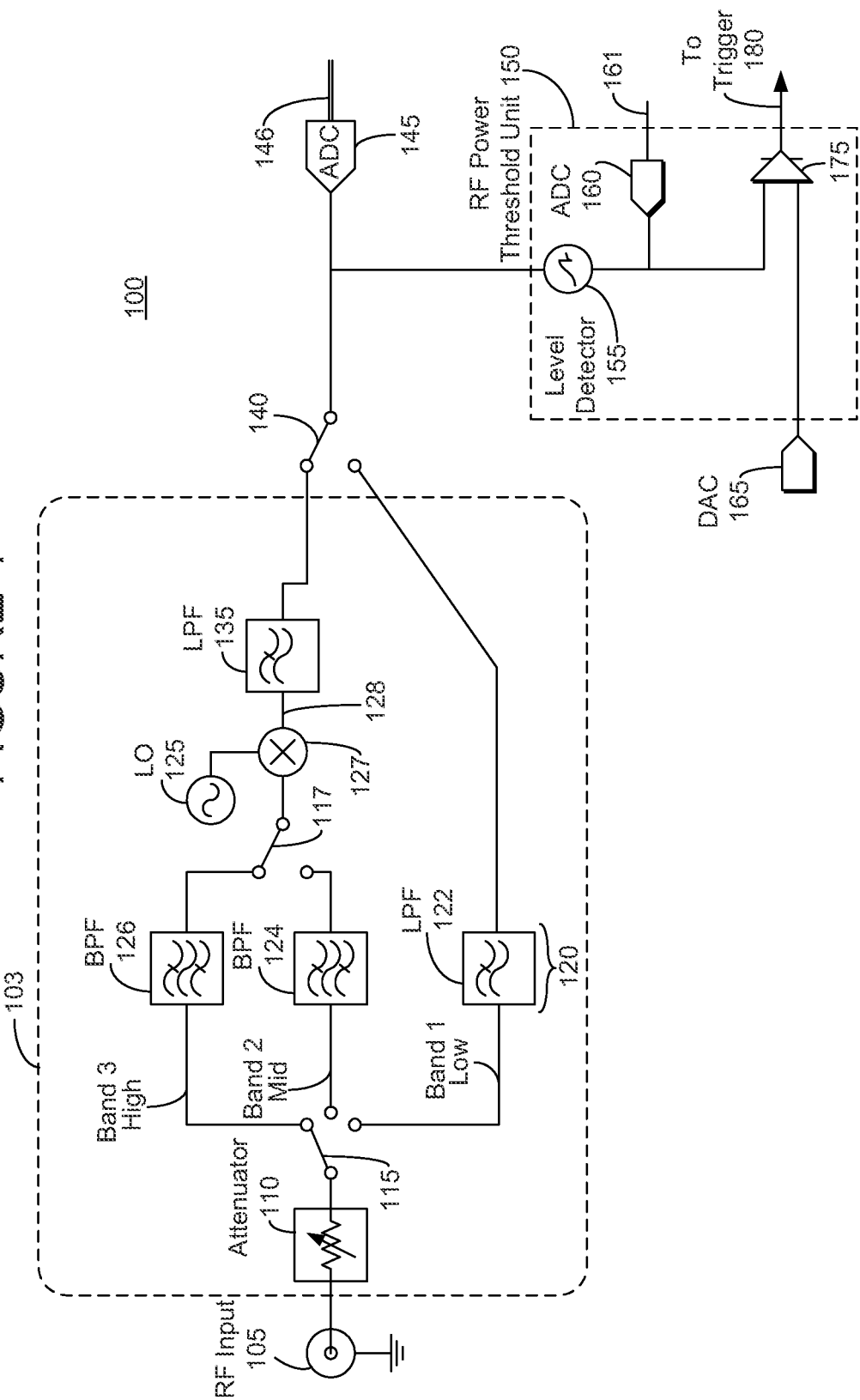
FIG. 1 illustrates a block diagram of components of a test and measurement instrument including acquisition circuitry and an RF power threshold unit according to an example embodiment of the invention.
Figure 2:
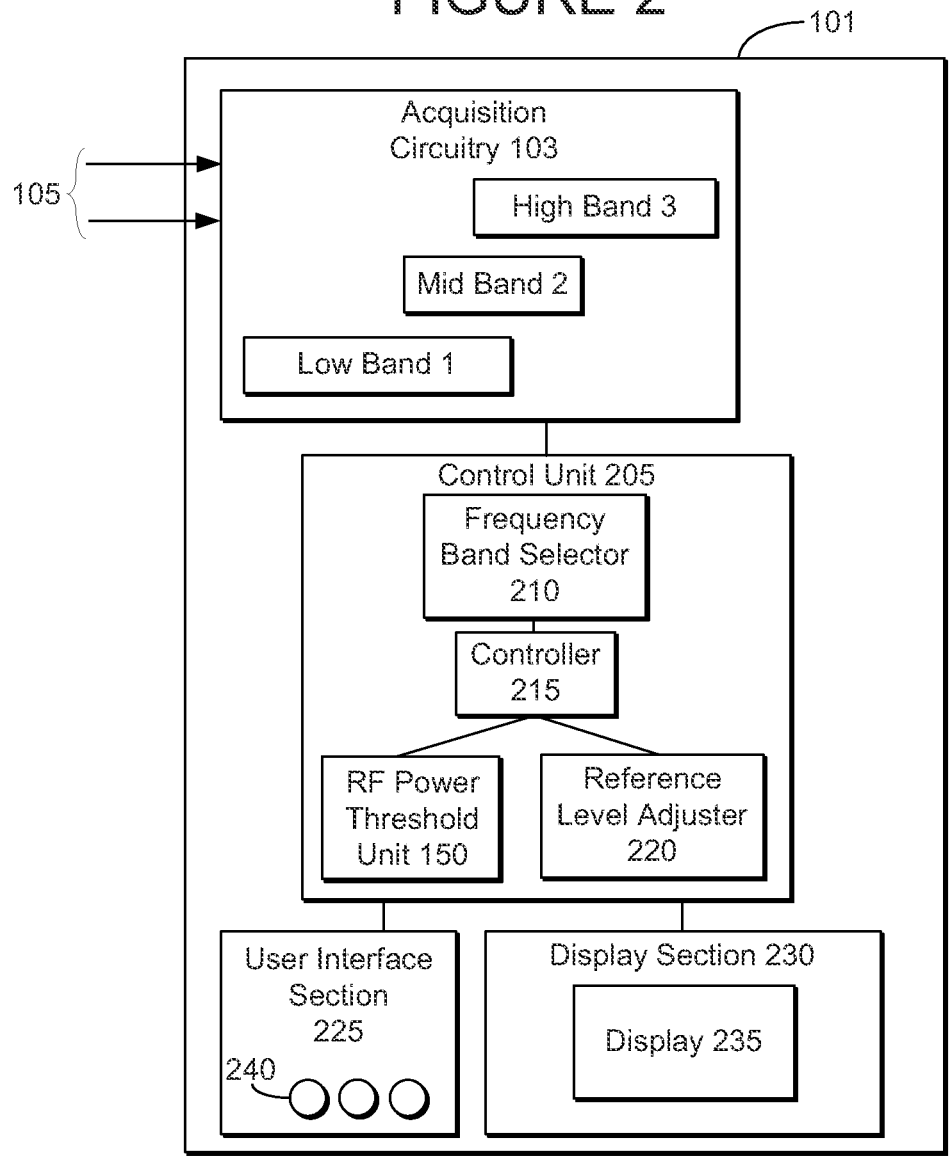
FIG. 2 illustrates a block diagram of a test and measurement instrument including the components of FIG. 1.

FIG. 1 illustrates a block diagram 100 of components of a test and measurement instrument including acquisition circuitry 103 and an RF power threshold unit 150 according to an example embodiment of the invention. FIG. 2 illustrates a block diagram of a test and measurement instrument 101 including the components of FIG. 1. Reference is now made to FIGS. 1 and 2.

The test and measurement instrument 101 is preferably a spectrum analyzer or mixed domain oscilloscope (MDO), although it will be understood that the embodiments of the invention are not limited to only these types of instruments. For example, the embodiments described herein can be incorporated in or otherwise associated with other suitable test and measurement devices. For the sake of clarity and consistency, but not limitation, the test and measurement instrument 101 will generally be referred to herein as a spectrum analyzer.

The spectrum analyzer 101 can have one or more channels or RF inputs 105. While certain components of the spectrum analyzer 101 are shown to be directly coupled to each other, it should be understood that the spectrum analyzer can include a variety of other circuit or software components, inputs, outputs, and/or interfaces, which are not necessarily shown, but that can be disposed between or otherwise associated with the illustrated components of the spectrum analyzer 101. It will be understood that the spectrum analyzer 101 and any of its components described herein can be implemented by hardware, software, and/or firmware, or any combination thereof.

The spectrum analyzer 101 can include an RF front end 103, or other acquisition circuitry, for acquiring and processing one or more RF input signals. The one or more RF input signals can include one or more electrical input signals under test. The acquisition circuitry 103 can include an attenuator and/or amplifier 110 coupled to the one or more RF input terminals 105 to receive the one or more input signals under test. A low band filtered path (e.g., Band 1), a mid band filtered path (e.g., Band 2), and a high band filtered path (e.g., Band 3) are capable of being coupled to the attenuator 110 through switch 115. The switch 115 is coupled to the attenuator 110 and is structured to divert the one or more input signals to at least one of the low band, mid band, and high band filtered paths, thereby producing a low frequency band, a mid frequency band, and a high frequency band, respectively. The mid and high frequency bands are associated with corresponding down converter bands.

The low frequency band, the mid frequency band, and the high frequency band can have overlapping frequency ranges, which can be predefined or otherwise preprogrammed to have particular frequency ranges and/or overlapping structures or characteristics. Filters 120 can be used to filter the signals for different paths, thereby creating different bands having different extents. For example, the low frequency path can be filtered using low pass filter 122 so that the low frequency band includes a frequency range up to 3.8 GHz, or thereabout. The mid frequency path can be filtered using a band pass filter 126 so that the mid frequency band includes a frequency range from 2.75 GHz, or thereabout, to 4.5 GHz, or thereabout. The high frequency path can be filtered using a band pass filter 124 so that the high frequency band includes a frequency range from 3.5 GHz, or thereabout, to 6 GHz, or thereabout. It will be understood that other kinds of filters can be used. While three bands are illustrated and described herein, it will be understood that two or more non-uniform overlapping bands can be used.

Each of the low frequency band, the mid frequency band, and the high frequency band correspond to a portion of a full frequency span. In other words, if the full frequency span is 6 GHz or thereabout, then the low frequency band represents a lower portion of the full frequency span, the mid frequency band represent a middle portion of the full frequency span, and the high frequency band represents a higher portion of the full frequency span. It will be understood that while these stated ranges are preferred ranges, different overlapping ranges can be used, having the same or different proportions.

The output of the filter 126 and the filter 124 can be fed to mixer 127 via switch 117. The mixer can mix a local oscillator signal 125 with one or more of the filtered signals to produce a mixed signal 128. The mixed signal 128 can be further filtered using low pass filter 135. The low pass filter 135 can operate or otherwise filter, for example, at 3 GHz or thereabout. Switch 140 can select between the output of the low pass filter 122 and the output of the low pass filter 135. One or more high speed analog-to-digital converters (ADC) 145 can digitize the signal received from the switch 140, and output a digitized signal 146.

The spectrum analyzer 101 also includes an RF power threshold unit 150 configured to automatically detect power levels for each frequency band. The RF power threshold unit 150 includes a level detector 155 and a low speed ADC 160 coupled to the level detector 155, and configured to digitize a signal received from the level detector 155 and produce a digitized measurement signal 161. One or more comparators 175 are configured to receive and compare a signal received from the level detector 155 with one or more trigger level signals 165, and to produce one or more trigger signals 180.

The spectrum analyzer 101 can include a control unit 205, which can include a controller 215, the RF power threshold unit 150, a frequency band selector 210, and a reference level adjuster 220, which are described in further detail below. The controller unit 205 can be coupled to a user interface section 225 and a display section 230 having display 235.

The output of the level detector 155 of the RF power threshold unit 150 measures which frequency band has the most power, and as a result, the frequency span can be automatically set so that the band having the most power is utilized in capturing and displaying frequency domain data. This gives the user of the spectrum analyzer a starting point to make further adjustments to view the frequency domain data in the way the user desires.

Each down converter band is intended for the capture of a certain range of frequencies, and can be used as such. As mentioned above, there can be frequency overlap among the bands and different frequency response of each down converter band. Since each band can have a different noise floor, an otherwise simpler test for which band provides the most detected power is inadequate. Instead, the relative power level in each band can be iteratively compared, and after analyzing the different power level quantities, an appropriate band can be automatically selected for use.

A reference level of a spectrum analyzer represents the uppermost graticule line of the analyzer display. In other words, if a reference level is set to +10 dBm, then an input signal frequency component peak of +10 dBm would be displayed extending upwards to the highest graduation of +10 dBm.

Starting with a high reference level, such as +5 dBm, or in other words, a low-level attenuation value, the power level can be automatically measured for each band. If a suitable minimum power is not found in one of the bands, the reference level can be automatically and iteratively decreased until the suitable minimum power is found, or until the most sensitive power level is reached. This assures enough sensitivity to correctly determine the signal power level and not make decisions based on noise. When power on any band is greater than the predefined noise criteria, then the band having the highest power level can be selected, and the center frequency and span for the band measuring the most power can be automatically set.

For example, the reference level adjuster 220 can set a reference level to an initial value, preferably a high value, as mentioned above. The level detector 155 can detect a power level of the first band in accordance with the reference level. The down converter band can be set to a second band, such as the mid frequency band. The level detector 155 can detect a power level of the second band in accordance with the reference level. The down converter band can be set to a third band, such as the high frequency band. The level detector 155 can detect a power level of the third band in accordance with the reference level.

If the power on all of the bands is less than the predefined noise criteria, then the reference level adjuster 220 can decrement the reference level. In other words, the attenuation level can be reduced until just above the noise floor for each band, with the power level of each band being measured along the way. Put differently, the level detector 155 repeatedly measures the power level of each band in accordance with each iteration of the reference level as the reference level is decremented. In this manner, over driving of the circuitry can be avoided or prevented.

If the power on any band is measured to be greater than the predefined noise criteria, then the reference level need not be decremented further. After power on any band is measured to be greater than the predefined noise criteria, and the power level of each of the bands has been measured in accordance with that reference level, the frequency band selector 210 can automatically select the band having the highest power level. In other words, to determine the appropriate frequency band, the power level for each band is compared to the power level of the other bands. The controller 215 can then automatically set a center frequency and span for the band having the highest measured power level.

To account for signal bursts, the power level reading of an associated band can be repeatedly measured over a period of time, in accordance with the particular reference level, so that a peak power level can be determined for that band. In other words, there may be "dead" periods in the signal and bursts on either end of the dead period. The peak or maximum value can be recorded during the reading period, so that at least one burst level reading is caught and used as the peak power level reading for that band and that reference level, thereby recording accurate peak power levels even in the presence of bursty signals.

In some cases, the same or substantially similar power level readings may result on two or more bands. The frequency versus power response of each band can be characterized. With this information, it can be determined that if, for example, the same power within an established power level difference is found in all bands, then the mid frequency band can be automatically selected. Or for example, if the same power within an established power level difference is found in only the upper two bands, then the high band can be automatically selected. By way of another example, if the low frequency band is the only band with measurable power, then the low frequency band can be automatically selected.

The user interface section 225 can receive user input, such as an "autoset" selection 240, which can cause the spectrum analyzer 101 to perform the automatic band selection, automatic setting of center frequency, and/or automatic setting of span. The user can also zero in on a specified frequency span of interest after the spectrum analyzer 101 has automatically initialized the configuration parameters described above. In other words, the user can select a more specific or particular frequency span of interest within the automatically selected band. In such instances, stitching need not be performed, which is a process of recombining separate frequency bands into a single coherent spectrum. And the user can trigger on criteria within the automatically selected band.

Figure 3:
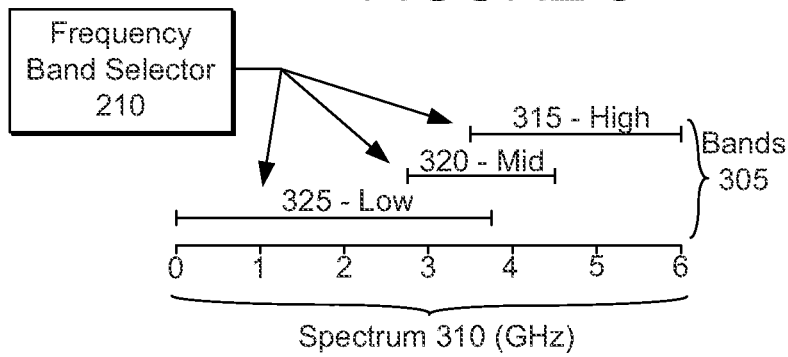
FIG. 3 illustrates a diagram of overlapping frequency bands in association with a frequency band selector according to another example embodiment of the invention.

FIG. 3 illustrates a diagram of overlapping frequency bands 305. The frequency band selector 210 can automatically select one of the low frequency band 325, mid frequency band 320, and/or high frequency band 315, in accordance with the methods and embodiments as set forth in detail above. The controller 215 can automatically set the center frequency and/or span for the band that is automatically selected based on the measured power levels, as explained in detail above.

The low band 325 of the bands 305 is associated with the low band filtered path, i.e., Band 1. The mid band 320 of the bands 305 is associated with the mid band filtered path, i.e., Band 2, and associated down converter band. The high band 315 of the bands 305 is associated with the high band filtered path, i.e., Band 3, and associated down converter band.

FIG. 4 illustrates a flow diagram 400 demonstrating a technique for automatically setting frequency span and other related configuration settings according to another example embodiment of the invention. The technique begins at 405, where the Ref_Level value is initialized to a high value. At 410, the reference level of the spectrum analyzer is set to the Ref_Level. The flow proceeds to 415, where BandNumber is initialized, preferably to a low value, or in other words, to a low frequency band. At 420, the down converter band is set to the BandNumber and the power level is measured for that band at 425. Thereafter, the BandNumber is incremented at 430, so that a higher frequency band can be measured next.

At 435, a determination is made whether the BandNumber is less than or equal to a predefined maximum number of bands. If YES, the flow returns to 420, where the down converter band is set to the new BandNumber and the power level for the new band is measured at 425. The BandNumber is again incremented at 430. These steps can be repeated until it is determined at 435 that the BandNumber is greater than the predefined maximum band number. When such a determination is made, the flow follows the NO path to 440, and another determination is made whether power on any band is greater than the predefined noise criteria. If NO, then the flow proceeds to 445, and the reference level is decremented.

Otherwise, if YES, meaning that power on at least one band was greater than the predefined noise criteria, then flow proceeds to 455, where the center frequency and span for the band measuring the most power can be set.

If the flow proceeded through the 445 block, and after decrementing the Ref_Level, then yet another determination is made at 450 whether the Ref_Level is less than a predefined minimum reference level value. If NO, the flow returns to 410 and the loop is repeated until the Ref_Level is less than the predefined minimum. After iteratively measuring the power levels of each band for an iterative series of reference levels, and after determining at 450 that the Ref_Level is less than the predefined minimum reference level value, then the flow proceeds to 455, where the center frequency and span for the band measuring the most power can be set. In this manner, the user need not manually search through each band in an attempt to find the band in which the energy content can be found, nor must the user manually set the center frequency and span, thereby saving time and simplifying the test and measurement setup. Trigger criteria can be selected by the user and the spectrum analyzer can trigger on the criteria within the automatically selected band.

Although particular embodiments have been described, it will be appreciated that the principles of the invention are not limited to those embodiments. For example, spectrum analyzers and other similar MDO devices are periodically expanding in their performance. Different bands can be used according to the performance characteristics and capabilities of the next generation test and measurement devices, without deviating from the inventive principals disclosed herein. The frequency ranges may be wider or narrower than specifically disclosed herein. The number of predefined frequency bands may be greater or fewer. The frequency ranges can overlap by varying amounts.

Some embodiments of the invention include a method for automatically setting frequency span in a spectrum analyzer, the method comprising setting a reference level to an initial value, measuring a first power level of the first band in accordance with the reference level, setting the down converter band to a second band, measuring a second power level of the second band in accordance with the reference level, determining whether at least one of the first and second power levels is higher than a noise criteria, and automatically setting a center frequency and span for the band having the highest measured power level if it is determined that at least one of the first and second power levels is higher than the noise criteria.

In some embodiments, the method can further include decrementing the reference level, measuring a third power level of the first band in accordance with the decremented reference level, setting the down converter band to the second band, measuring a fourth power level of the second band in accordance with the decremented reference level, determining whether at least one of the third and fourth power levels is higher than a noise criteria, and automatically setting a center frequency and span for the band having the highest measured power level if it is determined that at least one of the third and fourth power levels is higher than the noise criteria.

In some embodiments, the method can further include setting the down converter band to a third band, measuring a third power level of the third band in accordance with the reference level, determining whether at least one of the first, second, and third power levels is higher than a noise criteria, and automatically setting a center frequency and span for the band having the highest measured power level if it is determined that at least one of the first, second, and third power levels is higher than the noise criteria.

In some embodiments, the method can further include (a) decrementing the reference level, (b) measuring a power level of the first band in accordance with the decremented reference level, (c) setting the down converter band to the second band, (d) measuring a power level of the second band in accordance with the decremented reference level, (e) setting the down converter band to the third band, (f) measuring a power level of the third band in accordance with the decremented reference level, (g) determining whether at least one of the power levels associated with the first, second, and third bands is higher than a noise criteria, and automatically setting a center frequency and span for the band having the highest measured power level if it is determined that at least one of the power levels associated with the first, second, and third bands is higher than the noise criteria.

In some embodiments, the method can further include repeating (a) through (g) until at least one of the power levels of one of the bands is higher than the noise criteria, and automatically setting the center frequency and span for the band having the highest measured power level. The method can further include repeating (a) through (g) until the reference level is less than a minimum threshold, and automatically setting the center frequency and span for the band having the highest measured power level.

In some embodiments, the method can further include determining whether the power levels associated with the first, second, and third bands are substantially the same, and automatically setting a center frequency and span for the second band if it is determined that the power levels associated with the first, second, and third bands are substantially the same.

In some embodiments, the method can further include determining whether the power levels associated with the second and third bands are substantially the same, and automatically setting a center frequency and span for the third band if it is determined that the power levels associated with the second and third bands are substantially the same.

In some embodiments, the method can further include repeatedly measuring a power level reading of the associated band in accordance with the reference level during a period of time, selecting a maximum power level reading during the period of time, thereby accounting for signal bursts.

In some embodiments, an article drawn from the set of media including floppy disks, optical disks, fixed disks, volatile memory, non-volatile memory, random access memory, read-only memory, or flash memory, comprising a machine-accessible medium having associated non-transitory instructions that, when executed in a test and measurement device, results in a machine performing the steps of the various embodiments of the invention as disclosed herein. Other variations and modifications may be made without departing from the principles of the invention as set forth in the following claims.

The invention claimed is:

1. A method for automatically setting frequency span in a spectrum analyzer, the method comprising:
    setting a reference level to an initial value;
    measuring a first power level of a first band in accordance with the reference level;
    measuring a second power level of a second band in accordance with the reference level;
    determining whether at least one of the first and second power levels is higher than a noise criteria;
    automatically setting a center frequency and span for the band having the highest measured power level if it is determined that at least one of the first and second power levels is higher than the noise criteria;
    decrementing the reference level;
    measuring a third power level of the first band in accordance with the decremented reference level;
    measuring a fourth power level of the second band in accordance with the decremented reference level;
    determining whether at least one of the third and fourth power levels is higher than a noise criteria; and
    automatically setting a center frequency and span for the band having the highest measured power level if it is determined that at least one of the third and fourth power levels is higher than the noise criteria.

2. The method of claim 1, further comprising:
    measuring a third power level of the third band in accordance with the reference level;
    determining whether at least one of the first, second, and third power levels is higher than a noise criteria; and
    automatically setting a center frequency and span for the band having the highest measured power level if it is determined that at least one of the first, second, and third power levels is higher than the noise criteria.

3. The method of claim 2, further comprising:
    (a) decrementing the reference level;
    (b) measuring a power level of the first band in accordance with the decremented reference level;
    (c) setting a down converter band to the second band;
    (d) measuring a power level of the second band in accordance with the decremented reference level;
    (e) setting the down converter band to the third band;
    (f) measuring a power level of the third band in accordance with the decremented reference level;
    (g) determining whether at least one of the power levels associated with the first, second, and third bands is higher than a noise criteria; and
    automatically setting a center frequency and span for the band having the highest measured power level if it is determined that at least one of the power levels associated with the first, second, and third bands is higher than the noise criteria.

4. The method of claim 3, further comprising:
    repeating (a) through (g) until at least one of the power levels of one of the bands is higher than the noise criteria; and
    automatically setting the center frequency and span for the band having the highest measured power level.

5. The method of claim 3, further comprising:
    repeating (a) through (g) until the reference level is less than a minimum threshold; and
    automatically setting the center frequency and span for the band having the highest measured power level.

6. The method of claim 3, wherein:
    the first band is associated with a range of low frequencies;
    the third band is associated with a range of high frequencies relative to the low frequencies; and
    the second band is associated with a range of mid frequencies relative to the high and low frequencies.

7. The method of claim 6, further comprising:
    determining whether the power levels associated with the first, second, and third bands are substantially the same; and
    automatically setting a center frequency and span for the second band if it is determined that the power levels associated with the first, second, and third bands are substantially the same.

8. The method of claim 6, further comprising:
    determining whether the power levels associated with the second and third bands are substantially the same; and
    automatically setting a center frequency and span for the third band if it is determined that the power levels associated with the second and third bands are substantially the same.

9. The method of claim 1, wherein measuring includes:
    repeatedly measuring a power level reading of the associated band in accordance with the reference level during a period of time;
    selecting a peak power level reading during the period of time, thereby accounting for signal bursts.

10. One or more tangible computer-readable media storing non-transitory computer-executable instructions that, when executed by a processor, operate to perform the method according to claim 1.

11. A test and measurement device, comprising:
    a controller;
    a level detector coupled to the controller;
    an analog to digital converter (ADC) coupled to the level detector;
    a first band associated with a range of low frequencies;
    a third band associated with a range of high frequencies relative to the low frequencies;
    a second band associated with a range of mid frequencies relative to the high and low frequencies;
    a frequency band selector configured to automatically select the band having a highest measured power level; and
    a reference level adjuster configured to set a reference level to an initial value and to automatically decrement the reference level;

wherein the controller is configured to automatically set a center frequency and span for the band having the highest measured power level; and wherein the level detector is configured to measure the power level of each band for a series of decremented reference levels.

12. The test and measurement device of claim 11, wherein:
the level detector is configured to measure a second power level of the second band in accordance with the reference level.

13. The test and measurement device of claim 12, wherein:
the level detector is configured to measure a third power level of the third band in accordance with the reference level.

14. The test and measurement device of claim 13, wherein:
the frequency band selector is configured to automatically select the band having the highest measured power level.

15. The test and measurement device of claim 14, wherein:
the controller is configured to automatically set a center frequency and span for the band having the highest measured power level.

\* \* \* \* \*